United States Patent
Brandenburg et al.

(10) Patent No.: US 8,488,321 B2
(45) Date of Patent: Jul. 16, 2013

(54) ASSEMBLY FOR LIQUID COOLING ELECTRONICS BY DIRECT SUBMERSION INTO CIRCULATED ENGINE COOLANT

(75) Inventors: Scott D. Brandenburg, Kokomo, IN (US); Richard D. Parker, Tipton, IN (US); Joseph M. Lashbrook, Frankfort, IN (US)

(73) Assignee: Delphi Technologies, Inc., Troy, MI (US)

( * ) Notice: Subject to any disclaimer, the term of this patent is extended or adjusted under 35 U.S.C. 154(b) by 114 days.

(21) Appl. No.: 13/269,656

(22) Filed: Oct. 10, 2011

(65) Prior Publication Data

US 2013/0087307 A1 Apr. 11, 2013

(51) Int. Cl.
*H05K 7/20* (2006.01)
*F28F 7/00* (2006.01)

(52) U.S. Cl.
USPC ............ 361/699; 165/80.4; 361/719

(58) Field of Classification Search
USPC ........................................ 361/699
See application file for complete search history.

(56) References Cited

U.S. PATENT DOCUMENTS

| | | | | |
|---|---|---|---|---|
| 5,453,911 | A * | 9/1995 | Wolgemuth et al. | 361/689 |
| 5,740,015 | A * | 4/1998 | Donegan et al. | 361/699 |
| 6,588,647 | B2 * | 7/2003 | Yamada et al. | 228/112.1 |
| 6,892,796 | B1 * | 5/2005 | Nagashima et al. | 165/80.4 |
| 6,992,887 | B2 * | 1/2006 | Jairazbhoy et al. | 361/689 |
| 6,999,314 | B2 * | 2/2006 | Tonosaki et al. | 361/700 |
| 7,019,395 | B2 * | 3/2006 | Hirano et al. | 257/717 |
| 7,173,823 | B1 * | 2/2007 | Rinehart et al. | 361/699 |
| 2003/0053294 | A1 * | 3/2003 | Yamada et al. | 361/699 |
| 2005/0168949 | A1 * | 8/2005 | Tilton et al. | 361/699 |
| 2007/0230127 | A1 * | 10/2007 | Peugh et al. | 361/699 |

* cited by examiner

*Primary Examiner* — Gregory Thompson
(74) *Attorney, Agent, or Firm* — Lawrence D. Hazelton

(57) ABSTRACT

An assembly for liquid cooling electronics by direct submersion into circulated engine coolant that includes an epoxy material dispensed around leads of electronics devices in a manner effective to mechanically secure the electronics devices to the assembly and prevent engine coolant leakage around the leads, and a Parylene™ coating layer deposited in a manner effective to protect the electronic device from electrically conductive engine coolant such as ethylene glycol. Such an assembly is useful in hybrid electric vehicles that have engine coolant available from the vehicle's internal combustion engine.

14 Claims, 2 Drawing Sheets

ASSEMBLY FOR LIQUID COOLING ELECTRONICS BY DIRECT SUBMERSION INTO CIRCULATED ENGINE COOLANT

TECHNICAL FIELD OF INVENTION

This disclosure generally relates to liquid cooling of automotive power electronics, and more particularly relates to an assembly where electronics are cooled by direct submersion into circulated engine coolant.

BACKGROUND OF INVENTION

Hybrid electric vehicles have electric motors that are driven by high power solid state silicon transistors to switch power to the motors. Liquid cooling of power electronics allows for high levels of power dissipation by power electronics. However adding liquid cooling to a vehicle that uses a liquid suitable for direct cooling of the electronics (e.g. dielectric fluid) undesirably increases cost. Also adding complicated heat exchangers so heat from the electronics can be transferred to the already available engine coolant without exposing the electronics to the ionic contamination of engine coolant also undesirably increases cost. What is needed is a way to package power electronics so that the electronics can be directly exposed to readily available engine coolant.

SUMMARY OF THE INVENTION

In accordance with one embodiment, an assembly for liquid cooling electronics by direct submersion into circulated engine coolant is provided. The assembly includes a housing, a plate, a circuit board, an electronic device, a first heat spreader, a second heat spreader, an epoxy material region, and Parylene™ coating layer. The housing is configured to define a coolant inlet, a coolant outlet, and an opening providing access to engine coolant between the coolant inlet and the coolant outlet. The plate is configured to cooperate with the housing to form a fluidic seal along a perimeter of the opening. The plate is also configured to define a via through the plate. The circuit board is fixedly attached to the plate outside the housing and is configured to provide an electrical contact proximate to the via. The electronic device has a substantially planar shape that defines a plane. The electronic device is located proximate to the plate inside the housing and oriented to protrude into the coolant path such that the plane is substantially parallel to a flow direction of the engine coolant. The first heat spreader is fixedly attached to a first planar side of the electronic device, and is configured to define a first lead to electrically coupled the electronic device to the circuit board through the via. The second heat spreader is fixedly attached to a second planar side of the electronic device opposite the first planar side, and is configured to define a second lead to electrically coupled the electronic device to the circuit board through the via. The electronic device, the first heat spreader, and the second heat spreader form an arrangement. The epoxy material region is dispensed around the leads in a manner effective to mechanically secure the arrangement to the plate and prevent engine coolant leakage around the leads. The Parylene™ coating layer is deposited in a manner effective to protect the electronic device from the engine coolant.

Further features and advantages will appear more clearly on a reading of the following detailed description of the preferred embodiment, which is given by way of non-limiting example only and with reference to the accompanying drawings.

BRIEF DESCRIPTION OF DRAWINGS

The present invention will now be described, by way of example with reference to the accompanying drawings, in which.

DETAILED DESCRIPTION

Figure 1:
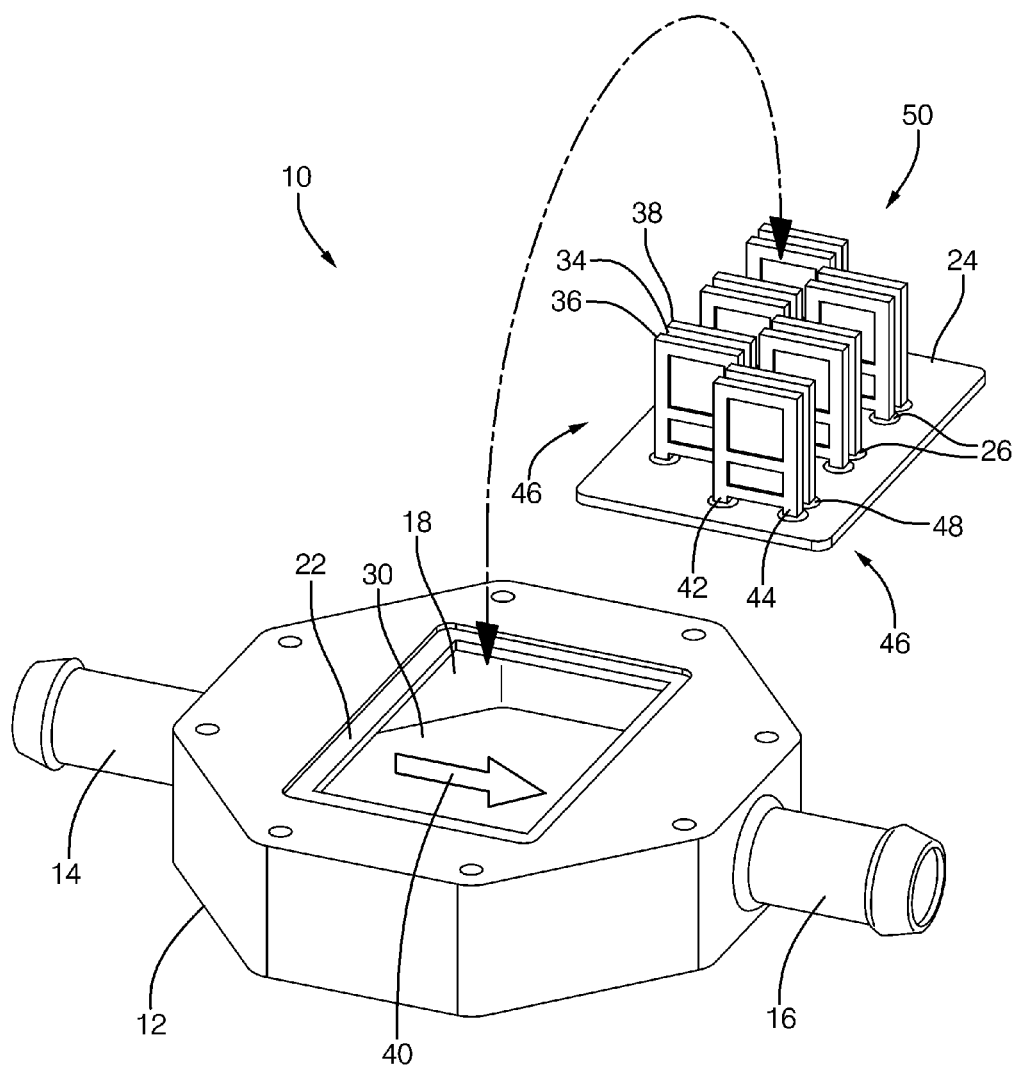
FIG. 1 is perspective view of a disassembled assembly in accordance with one embodiment.
Figure 2:
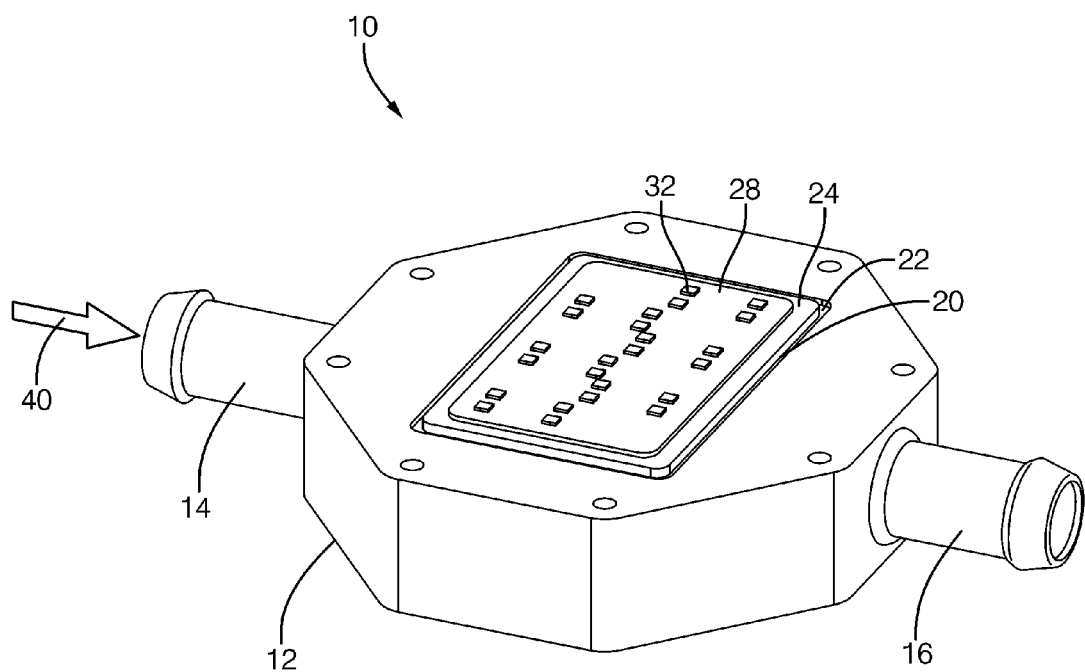
FIG. 2 is a perspective view of an assembled assembly of FIG. 1 in accordance with one embodiment.

FIGS. 1 and 2 illustrate a non-limiting example of an assembly 10 for liquid cooling electronics by direct submersion into circulated engine coolant. FIG. 1 illustrates a disassembled state so feature of the assembly 10 are readily seen, and FIG. 2 illustrates the assembly 10 as assembled. As will become clear in the description below, the assembly 10 is useful to cool electronics on an automobile where engine coolant is available to cool the electronics Typical engine coolants used for cooling internal combustion engine include may include a mixture of ethylene glycol and water, and a variety of contaminants that make the coolant electrically conductive. As such, exposing electronics to such engine coolant without taking steps to protect the electronics from the engine coolant may lead to improper operation and/or corrosive like damage to the electronics.

The assembly 10 may include a housing 12 generally configured to define a cavity 30 that at least in-part contains or routes the flow of engine coolant from a coolant inlet 14 to a coolant outlet 16. The housing 12 may be formed of, but not limited to, metal such as aluminum, or polymeric material having properties suitable for the application temperatures and pressures. The housing 12 may be formed by various methods such as casting, molding, machining, or other methods known to those skilled in the art, and combinations thereof. The housing may be a single unitary part, or may be an assembly of parts. The coolant inlet 14 and coolant outlet 16 may be formed of the same material as the housing 12, and may be formed at the same time as the housing 12. Alternatively, the coolant inlet 14 and coolant outlet 16 may be formed of a different material than the housing and assembled to the housing by various known methods such as welding, gluing, press fit insertion. By way of a non-limiting example, the housing may have a length of 130 millimeters (mm), a width of 60 mm, and a height of 25 mm.

The assembly 10 may include an opening 18 defined by the housing 12 to provide access to engine coolant present in the cavity 30, and possibly flowing between the coolant inlet 14 and the coolant outlet 16. A non-limiting example of the size of the opening 18 is 50 mm by 50 mm The assembly 10 may include a plate 24 configured to be attached to the opening 18 in order to cooperate with the housing 12 to form a fluidic seal 20 along a perimeter 22 of the opening 18 and thereby seal the cavity 30 from engine coolant leaks through the opening 18. The plate 24 is preferably formed of the same material as the housing 12 so the thermal expansion coefficient of the housing 12 and the plate 24 match. However alternative embodiments such as the housing 12 formed of aluminum and the plate 24 formed of a polymeric material are contemplated for reasons of cost savings. In an embodiment of the assembly 10 where the housing 12 and the plate 24 are aluminum, a suitable way to attach the plate 24 to the housing 12 may be by way of friction stir welding (FSW). Alternatively, if the housing 12 and the plate 24 are polymeric, a suitable way to attach the plate 24 to the housing 12 may be by way of gluing, that is, for example, applying an adhesive to the perimeter 22 and then placing the plate 24 over the opening 18. A suitable adhesive may be a silicon adhesive sealant such as DOW CORNING™ D94-30P.

The assembly 10 may include a circuit board 28 fixedly attached to the plate 24 outside of the cavity 30 defined by the housing 12. The circuit board 28 may be formed of commonly known circuit board materials such as FR-4 or an insert molded lead frame. The plate 24 may include one or more vias 26 through the plate 24 so, as will become evident in the description below, electrical contact can be made with the circuit board 28 by electrical components within the cavity 30. As such, the circuit board 28 may be configured to provide an electrical contact proximate to the via 26. The circuit board 28 may also include one or more electrical traces configured to interconnect various electrical contact 32 on the circuit board, or provide external electrical contacts (not shown) so an electrical connection may be made between the assembly and a controller (not shown).

The assembly 10 may include an electronic device 34, for example an Infineon insulated gate bipolar transistor (IGBT) die and a diode having typical dimensions of 12 mm by 12 mm with a thickness of about 0.07 mm. Such electronic devices typically have a substantially planar shape that can be used to define a plane corresponding to the orientation of the electronic device for the purpose of explanation. The electronic device 34 may be located proximate to the plate 24 and inside cavity 30 defined by the housing 12. The electronic device 34 is preferably oriented to protrude into the coolant path within the cavity 30, and be oriented such that the plane defined by the electronic device is substantially parallel to a flow direction 40 of the engine coolant in the cavity 30. Such an orientation is preferred in order to maximize heat transfer from the electronic device 34 to the engine coolant.

The assembly 10 may include a first heat spreader 36 and a second heat spreader 38 fixedly attached to a first planar side (not shown) and a second planar side (not shown) opposite the first planar side of the electronic device 34 as illustrated in FIG. 1. Both heat spreaders are configured to define a first lead 42 and a second lead 44 respectively to electrically coupled the electronic device 34 to the circuit board 28 through the via 26.

The assembly 10 may include a an epoxy material region 48 dispensed around the leads in a manner effective to mechanically secure the arrangement to the plate and prevent engine coolant leakage around the leads A suitable material may be a silica filled epoxy such as Namics G8345-6, or a boron-nitride filled epoxy. A filled epoxy is preferable as the material exhibits thermal expansion characteristics that are better matched to the expansion characteristics of the first lead 42 and the second lead 44.

The heat spreaders 36, 38 may be predominately formed of copper, for example pure copper or a copper alloy. Pure copper and some copper alloys provide excellent thermal conductivity and are easy to prepare for soldering by, for example, plating the copper with tin. Alternatively the heat spreaders 36, 38 may be predominately formed of molybdenum. Molybdenum has thermal expansion characteristics that are typically better matched to that of a silicon die being used as the electronic device 34, however to make soldering easier, a copper cladding layer may be added over a molybdenum core.

The heat spreaders 36, 38 may be fixedly attached to the electronic device 34 by sintering or soldering. Sintering may be advantageous for increased reliability and higher temperature capability, but is considered more expensive than soldering.

The assembly 10 may include a dielectric (electrically insulating) coating layer 50 formed of Parylene™ other dielectric materials such as Atomic Layer Deposition over Diamond like carbon or Si3N4. The coating layer 50 is preferably deposited in a manner effective to protect the electronic device 34 from the engine coolant. For example, the Parylene™ may be applied an electronics carrier 46 formed by assembling the plate 24, the circuit board 28, and the arrangement 46 formed by the electronic device 34, the first heat spreader 36, and the second heat spreader 38, with or without the epoxy material region 48 being in place. Parylene™ is preferred as it can be deposited in a relatively thin layer (e.g. <10 microns) and so provides good thermal conductivity between an arrangement 46.

Accordingly, an assembly 10 for liquid cooling electronics by direct submersion into circulated engine coolant is provided. The combination of the epoxy material region 48 and the Parylene™ coating layer 50 has been tested and found to provide excellent protection of the electronic device 34 from electrical and chemical contamination. The greater power dissipation capability of the assembly 10 also allows for a smaller electronic device 34 to be used without exceeding the maximum allowable junction temperature of the electronic device 34, or cause accelerated degradation of the bonds between the electronic device 34 and the heat spreaders 36, 38.

While this invention has been described in terms of the preferred embodiments thereof, it is not intended to be so limited, but rather only to the extent set forth in the claims that follow.

We claim:

1. An assembly for liquid cooling electronics by direct submersion into circulated engine coolant, said assembly comprising:

a housing configured to define a coolant inlet, a coolant outlet, and an opening providing access to engine coolant between the coolant inlet and the coolant outlet;

a plate configured to cooperate with the housing to form a fluidic seal along a perimeter of the opening, said plate also configured to define a via through the plate;

a circuit board fixedly attached to the plate outside the housing, said circuit board configured to provide an electrical contact proximate to the via;

an electronic device having a substantially planar shape that defines a plane, said electronic device located proximate to the plate inside the housing and oriented to protrude into the coolant path such that the plane is substantially parallel to a flow direction of the engine coolant;

a first heat spreader fixedly attached to a first planar side of the electronic device, said first heat spreader configured to define a first lead to electrically coupled the electronic device to the circuit board through the via;

a second heat spreader fixedly attached to a second planar side of the electronic device opposite the first planar side, said second heat spreader configured to define a second lead to electrically coupled the electronic device to the circuit board through the via, wherein the electronic device, the first heat spreader, and the second heat spreader form an arrangement;

an epoxy material region dispensed around the leads in a manner effective to mechanically secure the arrangement to the plate and prevent engine coolant leakage around the leads; and a coating layer deposited in a manner effective to protect the electronic device from the engine coolant.

2. The assembly in accordance with claim 1, wherein the engine coolant is essentially ethylene glycol.

3. The assembly in accordance with claim 1, wherein the housing and the plate are formed of metal.

4. The assembly in accordance with claim 3, wherein the housing and the plate are formed of aluminum.

5. The assembly in accordance with claim 4, wherein the fluidic seal between the housing and the plate is formed by friction stir welding.

6. The assembly in accordance with claim 1, wherein the housing and the plate are formed of polymeric material.

7. The assembly in accordance with claim 6, wherein the fluidic seal between the housing and the plate is formed of adhesive.

8. The assembly in accordance with claim 1, wherein the electronic device includes an insulated gate bipolar transistor (IGBT) and a diode.

9. The assembly in accordance with claim 1, wherein the first heat spreader and the second heat spreader are predominately formed of a copper.

10. The assembly in accordance with claim 9, wherein the first heat spreader and the second heat spreader predominately formed of a molybdenum.

11. The assembly in accordance with claim 1, wherein the first heat spreader and the second heat spreader are fixedly attached to the electronic device by sintering.

12. The assembly in accordance with claim 1, wherein the first heat spreader and the second heat spreader are fixedly attached to the electronic device by soldering.

13. The assembly in accordance with claim 1, wherein the first heat spreader is fixedly attached to the electronic device by sintering, and the second heat spreader is fixedly attached to the electronic device by soldering.

14. An assembly for liquid cooling electronics by direct submersion into circulated engine coolant, said assembly comprising:

a housing formed of aluminum and configured to define a coolant inlet, a coolant outlet, and an opening providing access to engine coolant between the coolant inlet and the coolant outlet;

a plate formed of aluminum and configured to cooperate with the housing to form a fluidic seal along a perimeter of the opening, wherein the fluidic seal between the housing and the plate is formed by friction stir welding, said plate also configured to define a via through the plate;

a circuit board fixedly attached to the plate outside the housing, said circuit board configured to provide an electrical contact proximate to the via;

an electronic device having a substantially planar shape that defines a plane, said electronic device located proximate to the plate inside the housing and oriented to protrude into the coolant path such that the plane is substantially parallel to a flow direction of the engine coolant;

a first heat spreader predominately formed of a molybdenum and fixedly attached to a first planar side of the electronic device by soldering, said first heat spreader configured to define a first lead to electrically coupled the electronic device to the circuit board through the via;

a second heat spreader predominately formed of a molybdenum and fixedly attached to a second planar side of the electronic device opposite the first planar side by soldering, said second heat spreader configured to define a second lead to electrically coupled the electronic device to the circuit board through the via, wherein the electronic device, the first heat spreader and the second heat spreader form an arrangement;

an epoxy material region dispensed around the leads in a manner effective to mechanically secure the arrangement to the plate and prevent engine coolant leakage around the leads; and a coating layer deposited in a manner effective to protect the electronic device from the engine coolant.

\* \* \* \* \*